United States Patent [19]

Nagai

[11] Patent Number: 5,764,669
[45] Date of Patent: Jun. 9, 1998

[54] SEMICONDUCTOR LASER INCLUDING DISORDERED WINDOW REGIONS

[75] Inventor: Yutaka Nagai, Tokyo, Japan

[73] Assignee: Mitsubishi Denki Kabushiki Kaisha, Tokyo, Japan

[21] Appl. No.: 584,200

[22] Filed: Jan. 11, 1996

[30] Foreign Application Priority Data

Jul. 5, 1995  [JP]  Japan ................................. 7-169955

[51] Int. Cl.$^6$ ....................................................... H01S 3/19
[52] U.S. Cl. ................................ 372/45; 372/46; 372/49
[58] Field of Search ............................. 372/45, 46, 49, 372/43, 44; 438/36–37

[56] References Cited

U.S. PATENT DOCUMENTS

| | | | |
|---|---|---|---|
| 4,827,483 | 5/1989 | Fukuzawa et al. | 372/45 |
| 4,875,216 | 10/1989 | Thornton et al. | 372/46 |
| 5,020,068 | 5/1991 | Isshiki | 372/46 |
| 5,376,582 | 12/1994 | Behfar-Rad et al. | 438/37 |
| 5,469,457 | 11/1995 | Nagai et al. | |
| 5,577,063 | 11/1996 | Nagai et al. | 372/46 |

FOREIGN PATENT DOCUMENTS

| | | |
|---|---|---|
| 0213826 | 3/1987 | European Pat. Off. |
| 1184974 | 7/1989 | Japan . |
| 396290 | 4/1991 | Japan . |
| 4103186 | 4/1992 | Japan . |
| 4103187 | 4/1992 | Japan . |

OTHER PUBLICATIONS

Itaya et al., "New Window-Structure InGaAlP Visisble Light Laser Diodes By Self-Selective Zn Diffusion-Induced Disordering", IEEE Journal of Quantum Electronics, vol. 27, No. 6, Jun. 1991, pp. 1496–1500.

Deppe et al., "Stripe-Geometry Quantum Well Heterostructure $Al_xGa_{1-x}As$–GaAs Lasers Defined By Defect Diffusion", Applied Physics Letters, vol. 49, No. 9, Sep. 1986, pp. 510–512.

Ralston et al., "Room-Temperature Exciton Transactions In Partially Intermixed GaAs/AlGaAs Superlattices", Applied Physics Letters, vol. 52, No. 19, May 1988, pp. 1511–1513.

Primary Examiner—Rodney B. Bovernick
Assistant Examiner—Luong-Quyen T. Phan
Attorney, Agent, or Firm—Leydig, Voit & Mayer, Ltd.

[57] ABSTRACT

A method for fabricating a semiconductor laser device includes successively epitaxially growing a quantum-well structure active layer and a second conductivity type $Al_yGa_{1-y}As$ first upper cladding layer on a first conductivity type GaAs substrate, forming an $SiO_2$ film on a region in a vicinity of the laser resonator facet on the second conductivity type first cladding layer, annealing, thereby absorbing Ga from the second conductivity type first upper cladding layer to form and diffuse vacancies to reach the quantum-well structure active layer, thereby disordering the quantum-well structure active layer in a region in the vicinity of the laser resonator facet. Therefore, it is possible to form a window structure by disordering the quantum-well structure active layer without generating crystal transitions. In addition, there is no necessity of implanting Si ions so as to diffuse those ions to form a window structure, and there arises no unlikelihood of disordering that because the Si ions are trapped during their diffusion by crystal defects formed by the ion implantation, whereby a semiconductor laser device provided with a desired window structure can be produced with high reproducibility.

1 Claim, 7 Drawing Sheets

Prior Art

Prior Art

Prior Art

SEMICONDUCTOR LASER INCLUDING DISORDERED WINDOW REGIONS

FIELD OF THE INVENTION

The present invention relates to a method of fabricating a semiconductor laser device and a semiconductor laser device and, more particularly, to a method of fabricating a semiconductor laser device that includes a window structure in the vicinity of the laser facet and that enables a high output operation, and a semiconductor laser device fabricated thereby.

BACKGROUND OF THE INVENTION

Figure 5:
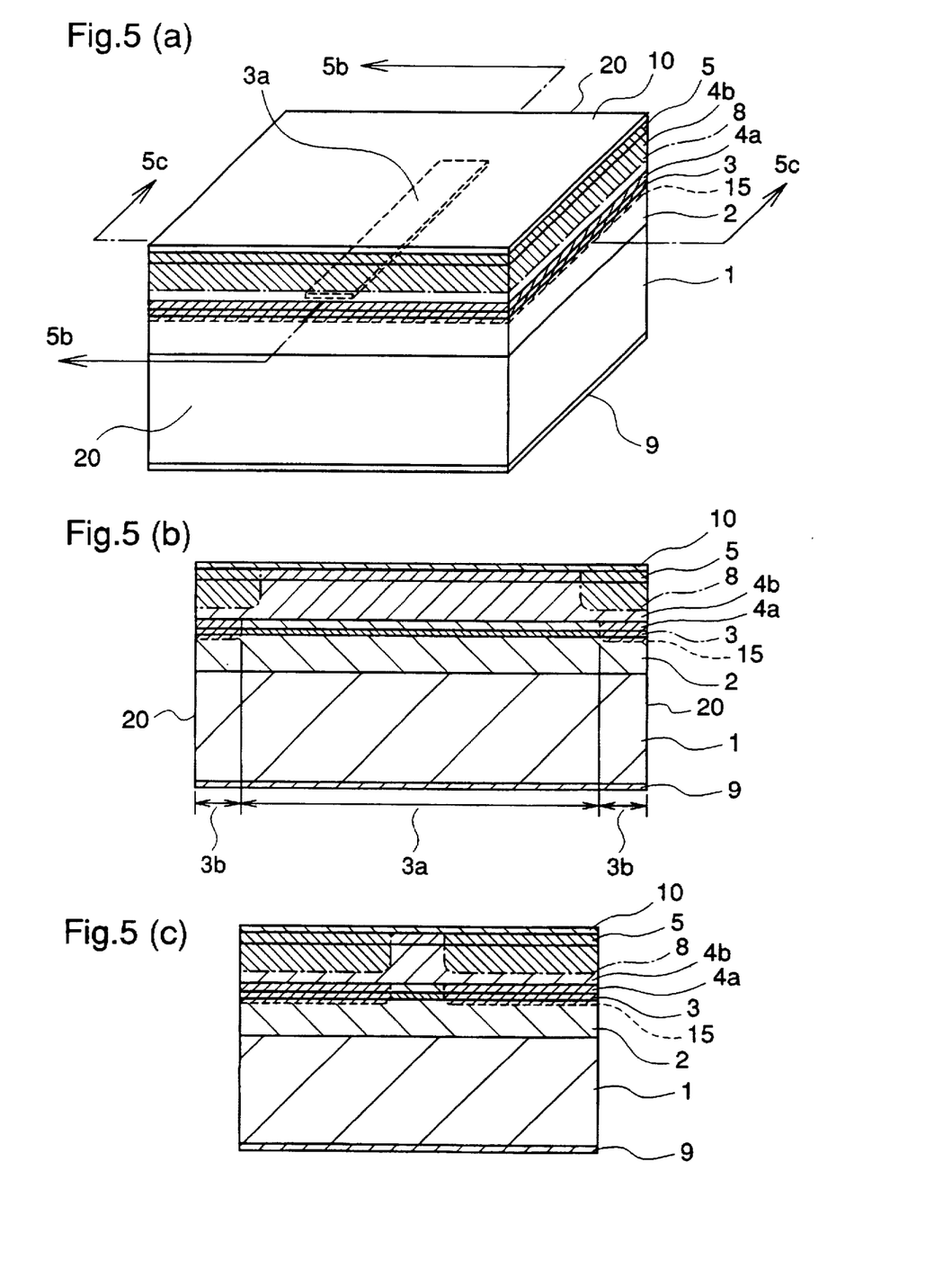
FIGS. 5(a)-5(c) are diagrams illustrating a prior art semiconductor laser device.

FIG. 5(a) is a perspective view of a semiconductor laser device, FIG. 5(b) is a cross-sectional view taken along a line 5b—5b of FIG. 5(a), i.e., in the resonator length direction of the semiconductor laser device, and FIG. 5(c) is a cross-sectional view taken along a line 5c—5c, i.e., in the direction perpendicular to the resonator length direction of the semiconductor laser device. In the figures, reference numeral 1 designates an n type GaAs substrate. An n type $Al_xGa_{1-x}As$ (x=0.5) lower cladding layer 2, 1.5–2 µm thick, is disposed on the n type GaAs substrate 1. A quantum-well structure active layer 3 comprising a plurality of $Al_yGa_{1-y}As$ (y=0.05–0.15) well layers (not shown) and $Al_zGa_{1-z}As$ barrier layers having an aluminum composition z of 0.2–0.35 (not shown) is disposed on the n type lower cladding layer 2. This quantum-well structure active layer 3 includes light guide layers (not shown) having the same composition as that of the barrier layers and a thickness of about 35 nm at both sides thereof, and it is constituted by three well layers about 10 nm thick and two barrier layers of about 10 nm thick alternatingly laminated with each other. Reference numeral 4a designates a p type $Al_rGa_{1-r}As$ (r=0.5) first upper cladding layer 0.05–0.5 µm thick, and numeral 4b designates a p type $Al_rGa_{1-r}As$ (r=0.5) second upper cladding layer, and the total thickness of the first upper cladding layer 4a and the second upper cladding layer 4b is about 1.5–2.0 µm. A p type GaAs contact layer 5, 0.5–1.0 µm thick, is disposed on the second upper cladding layer 4b. Reference numeral 8 designates a proton implantation region, numeral 9 designates an n side electrode, and numeral 10 designates a p side electrode. Reference numeral 15 designates a silicon (Si) diffusion region formed by ion implantation and annealing and numeral 20 designates a laser resonator facet. Reference numeral 3a designates an active region of the active layer 3 which contributes to the laser light emission and numeral 3b designates a window structure region in the vicinity of the laser resonator facet. This semiconductor laser device has a length in the laser resonator direction of 300–600 µm and a width of about 300 µm.

FIGS. 6(a)–6(e) are diagrams illustrating process steps in the method of fabricating the prior art semiconductor laser device. In the figures, the same reference numerals as in FIGS. 5(a)–5(c) designate the same or corresponding parts. Reference numeral 11 designates a stripe shaped first photoresist, numeral 14 designates a second photoresist, and arrows 23 indicate proton implantation, respectively.

A description is given of the fabricating method of the semiconductor laser device with reference to FIGS. 6(a)–6(e).

Figure 6:
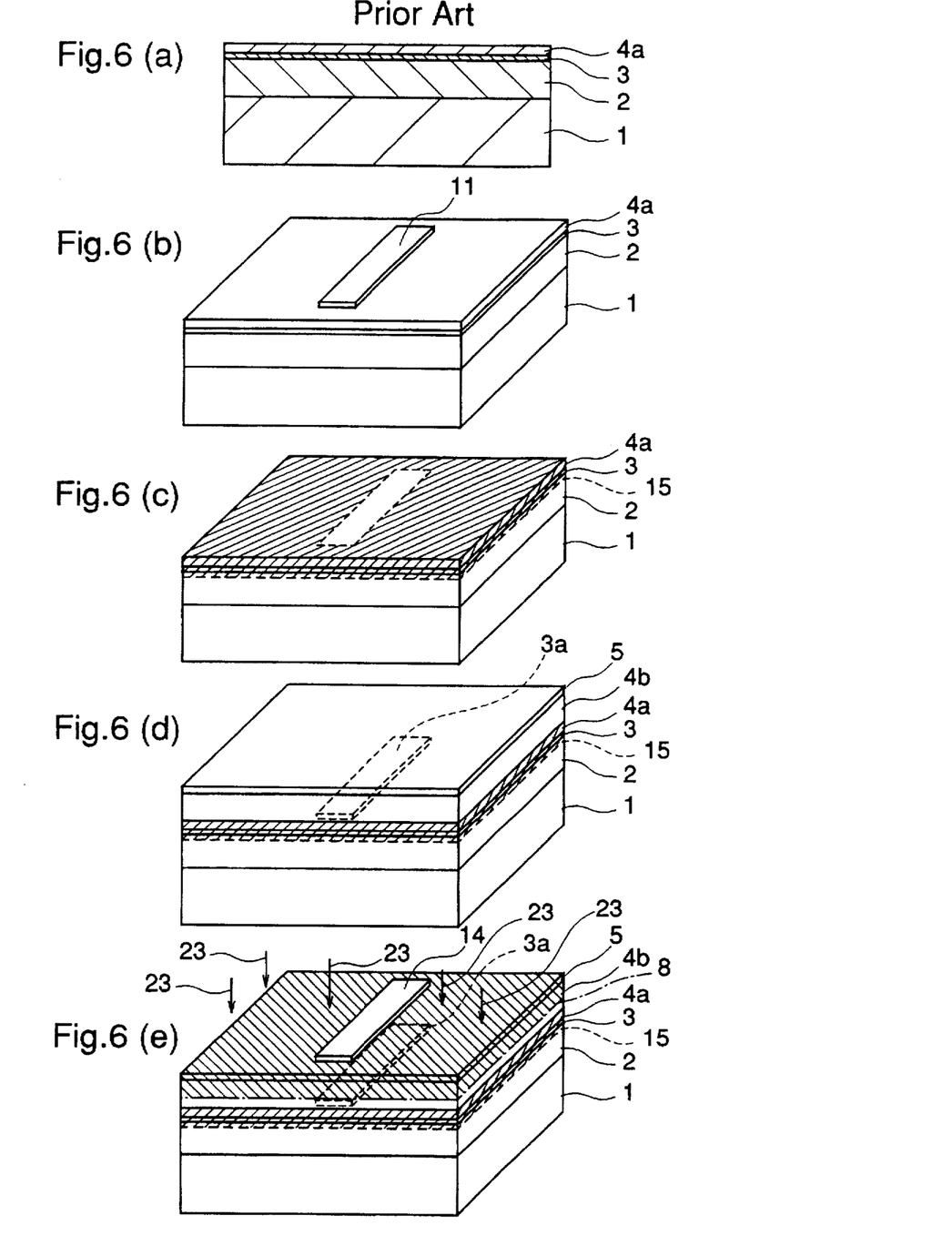
FIGS. 6(a)-6(e) are diagrams illustrating process steps in a method of fabricating a prior art semiconductor laser device.

A lower cladding layer 2, a quantum-well structure active layer 3, and a first upper cladding layer 4a are successively epitaxially grown on an n type GaAs substrate 1 in a wafer state. The cross-section of the wafer after the growth is shown in FIG. 6(a). Next, photoresist is applied to the surface of the contact layer 5 and it is patterned to form a stripe shaped first photoresist mask 11 extending in what becomes the laser resonator length direction and not reaching the position which becomes the laser resonator facet. The interval between the photoresist mask 11 and the position which becomes the resonator facet of the semiconductor laser device is about 20 µm, and the length of the stripe shaped photoresist mask in the direction perpendicular to the laser resonator length direction is 1.5–5 µm.

Subsequently, ion implantation of Si is performed, reaching the active layer 4, from the upper surface of the first upper cladding layer 4a employing the photoresist mask 11 as an ion implementation mask, and the photoresist mask 11 is removed. Then, the Si dose amount to the region where the Si ions are to be implanted is set to $1 \times 10^{13} - 1 \times 10^{14}$ cm$^{-2}$. At the region below the photoresist mask 11, no Si ions are implanted. Here, after removal of the photoresist mask 11, annealing is carried out so as to disorder the active layer 3. This is carried out because no disordering of the active layer 3 occurs solely by the ion implantation; thermal processing is required to make the Si atoms diffuse in the crystal. Generally employed as this thermal processing is a method of annealing the wafer at a temperature above 700° C. in an ambient with As pressure applied. As a result of this annealing, the Si diffused region 15 is formed as shown in FIG. 6(c), and the quantum-well structure active layer 3 in this region 15 is disordered. A region in the vicinity of the laser resonator facet of the disordered quantum-well structure active layer 3 becomes a window structure region 3b. The region other than the disordered region becomes the active region 3a.

Next, in the step of FIG. 6(d), after the second upper cladding layer 4b and the contact layer 5 are successively epitaxially grown on the first upper cladding layer 4a, the upper surface of the contact layer 5 is covered by photoresist and it is patterned by the photolithographic technique. In the step of FIG. 6(e), on a region where the stripe shaped first photoresist mask 11 is formed, a stripe shaped second photoresist 14 extending in the laser resonator direction and having approximately the same size as the first photoresist mask 11 is formed, and implantation of protons is carried out from the upper surface of the contact layer 5 employing the resist 14 as a mask so that the implantation peak is positioned in the second upper cladding layer 4b. Thereby, a region 8 where implantation of proton is carried out is formed in the contact layer 5 and the second upper cladding layer 4b, and this region 8, which is a high resistance region, serves as a current blocking layer.

At last, after removal of the resist 14, a p side electrode 10 is formed on the contact layer 5, an n side electrode 9 is formed on the substrate 1, and a laser resonator facet 20 is formed by cleaving, thereby producing a semiconductor laser device provided with a window structure as shown in FIGS. 5(a)–5(c).

A description is given of the operation of the prior art semiconductor laser device. When a plus voltage is applied to the p side electrode 10 and a minus voltage is applied to the n side electrode 9, holes are injected into the quantum-well structure active layer 3 through the p type contact layer 5, the p type second upper cladding layer 4b, and the p type first upper cladding layer 4a, and electrons are injected into the quantum-well structure active layer 3 through the n type semiconductor substrate 1 and the n type AlGaAs cladding layer 2, and recombination of electrons and holes occurs in the active region of the active layer 3, thereby generating induced emission light in the active region 3a of the quantum-well structure active layer 3. When light exceeding the waveguide loss is generated by sufficiently increasing the injected amount of carriers, laser oscillation occurs. Here, since the region 8 where implantation of proton is carried out becomes high resistance because of the proton implantation, no current flows through the p type contact layer 5 and the p type second upper cladding layer 4b in the proton implantation region 8. In other words, a current flows through only the region where no proton implantation is carried out.

Figure 7:
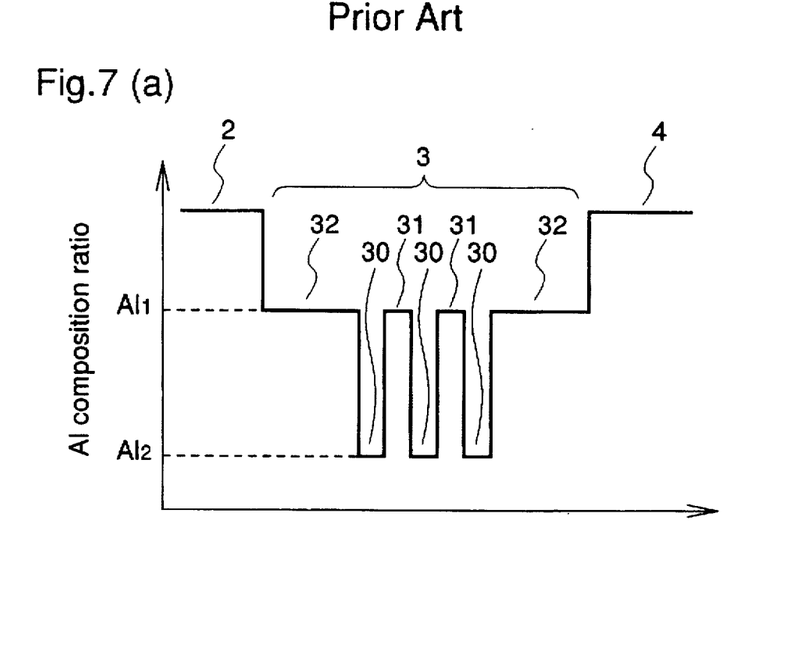
FIGS. 7(a)-7(b) are graphs showing aluminum profiles for explaining disordering of a quantum-well structure active layer in the prior art semiconductor laser device.

A description is given of the window structure. Generally, the maximum light output of an AlGaAs series semiconductor laser device that emits a laser beam having a 0.8 μm wavelength and that is employed as a light source of an optical disc apparatus, such as compact disc (CD), is determined by the light output at which facet destruction is generated. The facet destruction is a phenomenon in which the crystal itself constituting the semiconductor laser device is melted by the heat generated due to the light absorption by the surface energy levels at the facet region. Therefore, in order to realize high light output operation, the device is required not to have facet destruction even with a high light output. In order to realize that, it is very effective to provide a structure that makes the facet region of the active layer not absorb the laser beam, i.e., to provide a window structure that is "transparent" to the laser beam. This window structure is obtained by providing a region that has a higher energy band gap than the active region of the active layer that emits the laser beam in the vicinity of the laser resonator facet. In the prior art semiconductor laser device shown in FIG. 5(a), since the active layer 3 comprises a quantum-well structure, the window structure is formed by disordering of the quantum-well structure 3 by the Si ion implantation 22 and the annealing. FIGS. 7(a) and 7(b) show a profile of aluminum composition of the quantum-well structure active layer 3 before the disordering and a profile of aluminum composition of the quantum-well structure active layer 3 after the disordering, respectively.

In FIGS. 7(a) and 7(b), the same reference numerals as in FIG. 1 designate the same or corresponding parts. Reference numerals 30, 31, and 32 designate a well layer, a barrier layer, and a light guide layer, respectively, of the active layer 3. In the figures, the ordinate represents Al composition ratio and the abscissa represents position in the crystal growth direction, of the lower cladding layer 2, the active layer 3, and the upper cladding layer 4. Reference character Al2 represents Al composition ratio of the well layer 30, Al1 represents Al composition ratio of the barrier layer 31 and the light guide layer 32, and Al3 represents Al composition ratio of the active layer 3 after the disordering, respectively. When silicon atoms (Si) are implanted into the quantum-well structure active layer 3 shown in FIG. 7(a) and annealed, the atoms constituting the well layer 30 and the barrier layer 32 are mixed with each other, and the diffused region becomes a disordered region as shown in FIG. 7(b). As a result, the Al composition ratio of the disordered quantum-well structure active layer 3 becomes the Al composition ratio Al3 that is approximately equal to the Al composition ratio Al1 of the barrier layer 31 and the light guide layer 32, and the effective energy band gap of the active layer 3 becomes approximately equal to those of the barrier layer 31 and the light guide layer 32. Accordingly, in the prior art semiconductor laser device shown in FIG. 5(a), the effective energy band gap of the disordered region of the quantum-well structure active layer 3 becomes larger than the effective energy band gap of the active layer 3 that is not disordered and serves as the active region 3a, and the disordered region of the quantum-well structure active layer 3 serves as a window structure that is "transparent" to the laser light and the region of the quantum-well structure active layer 3 in the vicinity of the laser resonator facet 20 serves as the window structure region 3b.

In the prior art semiconductor laser device having a window structure, the quantum-well structure active layer 3 in the vicinity of the laser resonator facet 20 is disordered by the diffusion of Si to form the window structure region 3b. In this semiconductor laser device, however, in the process of ion implanting Si in the fabricating process, a lot of crystal defects are generated in the ion implanted semiconductor layer, whereby a lot of crystal dislocations are generated in the first upper cladding layer 4a and the active layer 3. This is because while the atoms accelerated by a voltage are implanted in the crystal, they repeatedly collide with atoms in the crystal, losing their energy and are finally stopped, generating a lot of defects in the crystal. Although such crystal transitions restore themselves to some degree in the annealing, they do not restore themselves completely and the crystal dislocations partially remain as they are. Since these crystal dislocation absorb the laser light, even when the quantum-well structure active layer 3 is disordered to increase its energy band gap to a value larger than that of the active region 3a to form a window structure region 3b, it does not serve effectively as a window structure.

When there are many crystal defects which would generate crystal transitions, the silicon atoms themselves which are diffused by the annealing are trapped at the crystal defects, thereby making the diffusion difficult. This makes the disordering unlikely to occur and unable to produce a semiconductor laser device with a desired window structure with high reproducibility.

SUMMARY OF THE INVENTION

It is an object of the present invention to provide a method of fabricating a semiconductor laser device that can form a window structure without generating crystal transitions as well as with high reproducibility.

It is another object of the present invention to provide a semiconductor laser device that has a window structure that is formed without generating crystal transitions as well as with high reproducibility.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, a method for fabricating a semiconductor laser device comprises forming successively a first conductivity type $Al_xGa_{1-x}As$ ($0<x<1$) lower cladding layer, a quantum-well structure active layer comprising an $Al_zGa_{1-z}As$ ($0<z<x$) barrier layer and an $Al_yGa_{1-y}As$ ($0<y<z$) well layer, and a second conductivity type $Al_rGa_{1-r}As$ ($z<r<1$) first upper cladding layer on the front surface of the first conductivity type GaAs substrate by epitaxial growth, forming a silicon dioxide ($SiO_2$) film on a region in the vicinity of the laser resonator facet on the second conductivity type first cladding layer, annealing the $SiO_2$ film and the semiconductor layers formed by epitaxial growth, and absorbing Ga from the second conductivity type first upper cladding layer to form vacancies as well as diffusing the vacancies up to reaching the quantum-well structure active layer, thereby disordering the quantum-well structure active layer in the region in the vicinity of the laser resonator facet, and after removal of the $SiO_2$, regrowing successively a second conductivity type $Al_rGa_{1-r}As$ (z<r<1) second cladding layer and a second conductivity type GaAs contact layer on the second conductivity type first upper cladding layer by epitaxial growth. Therefore, there is no necessity of implanting Si ions, and it is possible to form a window structure by disordering the quantum-well structure active layer without generating crystal transitions. In addition, there is no necessity of implanting Si ions so as to diffuse those to form a window structure as well as there arises no unlikelihood of disordering due to that Si ions are trapped during their diffusion by a lot of crystal defects which are formed by the ion implantation, whereby a semiconductor laser device provided with a desired window structure can be obtained with high reproducibility.

According to a second aspect of the present invention, a method for fabricating a semiconductor laser device comprises forming successively a first conductivity type $Al_xGa_{1-x}As$ (0<x<1) lower cladding layer, a quantum-well structure active layer comprising an $Al_zGa_{1-z}As$ (0<z<x) barrier layer and an $Al_yGa_{1-y}As$ (0<y<z) well layer, and a second conductivity type $Al_rGa_{1-r}As$ (z<r<1) first upper cladding layer on a first conductivity type GaAs substrate by epitaxial growth, forming a silicon dioxide ($SiO_2$) film having a stripe shaped opening with a prescribed width not reaching the laser resonator facet extending in the direction becoming a laser resonator length direction on the second conductivity type first upper cladding layer, annealing the $SiO_2$ film and the semiconductor layers formed by epitaxial growth, and absorbing Ga from the second conductivity type first upper cladding layer to form vacancies as well as diffusing the vacancies up to reaching the quantum-well structure active layer, thereby disordering the quantum-well structure active layer in the region in the vicinity of the laser resonator facet, after removal of the $SiO_2$ film, regrowing successively a second conductivity type $Al_rGa_{1-r}As$ (z<r<1) second upper cladding layer and a second conductivity type GaAs contact layer on the second conductivity type first upper cladding layer by epitaxial growth, forming a resist film on a region on the contact layer where the stripe shaped opening is formed, and implanting protons to a depth not reaching to the quantum-well structure active layer from above the contact layer, and after removal of the resist, forming electrodes on the rear surface of the GaAs substrate and on the upper surface of the contact layer. Therefore, there is no necessity of implanting Si ions, and it is possible to form a window structure by disordering the quantum-well structure active layer without generating crystal transitions. In addition, there is no necessity of implanting Si ions so as to diffuse those to form a window structure, whereby a semiconductor laser device provided with a desired window structure can be obtained with high reproducibility.

According to a third aspect of the present invention, the above-described method further comprises after forming the $SiO_2$ film, forming a silicon nitride ($Si_3N_4$) film on a region above the $SiO_2$ film and the second conductivity type first upper cladding layer where the stripe shaped opening is formed, and after disordering the quantum-well structure active layer, removing the $Si_3N_4$ film. Therefore, in the annealing process, the surface roughness of the first upper cladding layer can be prevented by preventing the slipping out of As from the surface of the first upper cladding layer exposed to the stripe shaped opening.

According to a fourth aspect of the present invention, in the above-described method, the process of epitaxially growing the second conductivity type $Al_rGa_{1-r}As$ (z<r<1) first upper cladding layer is followed by epitaxially growing a GaAs surface protecting layer subsequently performed thereto. Therefore, the oxidation of the regrowth interface is prevented and the surface roughness of the regrowth surface can be prevented.

According to a fifth aspect of the present invention, a semiconductor laser device comprises a first conductivity GaAs substrate, a first conductivity type $Al_xGa_{1-x}As$ (0<x<1) disposed on the substrate, a quantum-well structure active layer comprising first conductivity type $Al_zGa_{1-z}As$ (0<z<x) barrier layers and $Al_yGa_{1-y}As$ (0<y<z) well layers, and having a region which is disordered by diffusing the vacancies in the vicinity of the laser resonator facet, disposed on the lower cladding layer, a second conductivity type $Al_rGa_{1-r}As$ (z<r<1) first upper cladding layer disposed on the quantum-well structure active layer, a second conductivity type $Al_rGa_{1-r}As$ (z<r<1) second upper cladding layer disposed on the first upper cladding layer, and a second conductivity type GaAs contact layer disposed on the second upper cladding layer. Therefore, there is no necessity of implanting Si ions to disorder the quantum-well structure active layer, and it is possible to form a window structure by disordering the quantum-well structure active layer without generating crystal transitions. In addition, there is no necessity of implanting Si ions so as to diffuse those to form a window structure, and there arises no unlikelihood of disordering due to that Si ions are trapped during their diffusion by a lot of crystal defects which are formed by the ion implantation, whereby a semiconductor laser device provided with a desired window structure can be obtained with high reproducibility.

According to a sixth aspect of the present invention, in the semiconductor laser device, the quantum-well structure active layer is disordered at the region other than the stripe shaped active region having a prescribed width extending in the laser resonator direction among the region except the vicinity of the laser resonator facet by the diffusion of vacancies, regions of an upper portion of the second upper cladding layer and the contact layer other than the region on the active region are made of high resistance by the implantation of protons, and electrodes are disposed on the rear surface of the GaAs substrate and on an upper surface of the contact layer. Therefore, there is no necessity of implanting Si ions to disorder the quantum-well structure active layer, and it is possible to form a window structure by disordering the quantum-well structure active layer without generating crystal transitions. In addition, there is no necessity of implanting Si ions so as to diffuse those to form a window structure, whereby a semiconductor laser device provided with a desired window structure can be obtained with high reproducibility.

According to a seventh aspect of the present invention, in the semiconductor laser device, a GaAs surface protecting layer is inserted between the second conductivity type first upper cladding layer and the second conductivity type second upper cladding layer, thereby preventing the surface roughness of the regrowth surface.

DETAILED DESCRIPTION OF THE PREFERRED EMBODIMENTS

Embodiment 1

Figure 1:
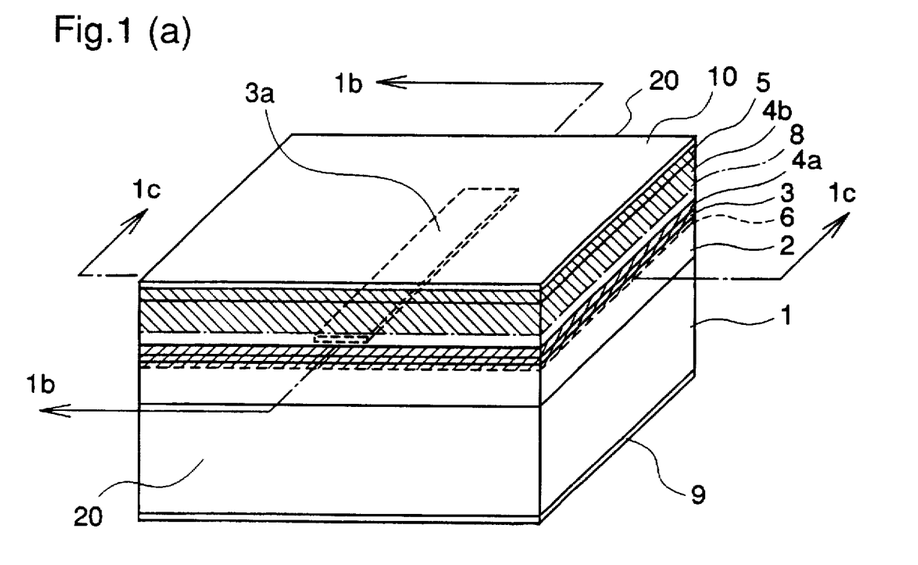
FIGS. 1(a)–1(c) are diagrams illustrating a semiconductor laser device according to a first embodiment of the present invention.

FIG. 1(a) is a perspective view illustrating a structure of a semiconductor laser device according to a first embodiment of the present invention. FIG. 1(b) is a cross-sectional view taken along a line 1b—1b of FIG. 1(a), i.e., in the laser resonator length direction of FIG. 1(a), and FIG. 1(c) is a cross-sectional view taken along a line 1c—1c of FIG. 1(a), i.e., in the direction perpendicular to the laser resonator length direction of FIG. 1(a). In FIGS. 1(a)-1(c), reference numeral 1 designates an n type GaAs substrate. An n type $Al_xGa_{1-x}As$ (x=0.5) lower cladding layer 2, 1.5~2.0 µm thick, is disposed on the n type GaAs substrate 1. A quantum-well structure active layer comprising three $Al_yGa_{1-y}As$ (y=0.05~0.15) well layers (not shown) about 10 nm thick and two $Al_zGa_{1-z}As$ (z=0.2~0.35) barrier layers (not shown) about 10 nm thick alternatingly laminated with each other, and further provided with light guide layers (not shown) about 35 nm thick having the same composition as the barrier layers at the both sides of the quantum well structure, is disposed on the lower cladding layer 2. Reference numeral 4a is a p type $Al_rGa_{1-r}As$ (r=0.5) first upper cladding layer and numeral 4b is a p type $Al_rGa_{1-r}As$ (r=0.5) second upper cladding layer, respectively, in which the total thickness of the first upper cladding layer 4a and the second upper cladding layer 4b is about 1.5~2.0 µm. Reference numeral 5 designates a p type GaAs contact layer 0.5~1.0 µm thick and numeral 8 designates a proton implanted region. Reference numeral 9 designates an n side electrode and numeral 10 designates a p side electrode. Reference numeral 6 designates a vacancy diffusion region, numeral 20 designates a laser resonator facet, numeral 3a designates an active region contributing to the laser light emission of the active layer 3, and numeral 3b designates a window structure region formed in the vicinity of the laser resonator facet 20 of the active layer 3. In addition, the semiconductor laser device is 300~600 µm long in the resonator length direction and 300 µm in width.

FIGS. 2(a)-2(e) are diagrams illustrating process steps in a method of fabricating a semiconductor laser device according to a first embodiment of the present invention. In the figures, the same reference numerals as in figures 1(a) –1(c) designate the same or corresponding parts. Reference numeral 16 designates an $SiO_2$ film, numeral 16a designates a stripe shaped opening extending in what becomes a laser resonator length direction and disposed on the $SiO_2$ film 16, numeral 17 designates a photoresist, and arrows 23 indicate proton implantations, respectively.

Figure 2:
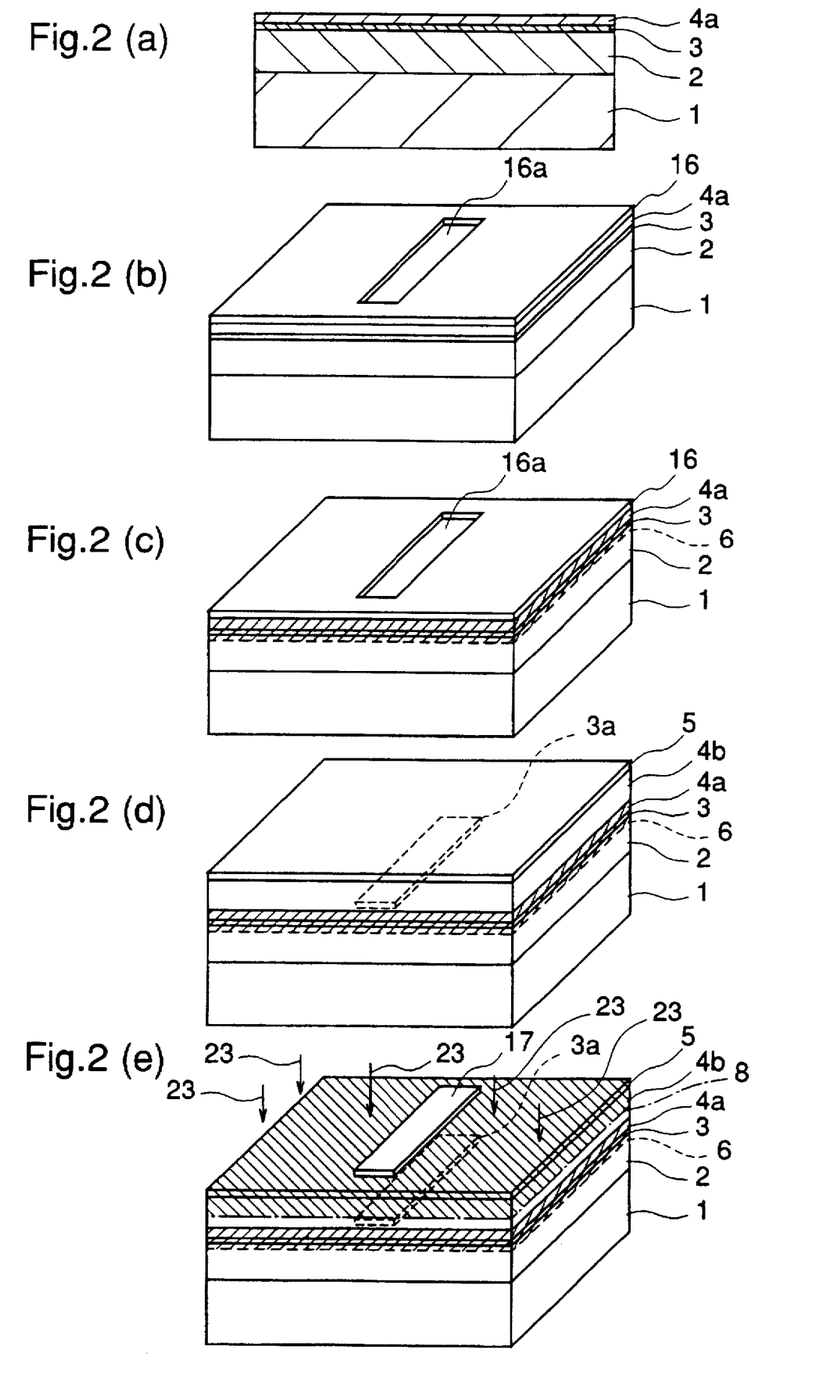
FIGS. 2(a)–2(e) are diagrams illustrating process steps in a method of fabricating a semiconductor laser device according to the first embodiment of the present invention.

A description is given of the fabricating method. Initially, the n type $Al_xGa_{1-x}As$ (x=0.5) lower cladding layer 2, the quantum-well structure active layer 3, and the p type $Al_rGa_{1-r}As$ (r=0.5) first upper cladding layer 4a are successively epitaxially grown on the n type GaAs substrate 1 which is in a wafer state. For this crystal growth method, metal organic chemical vapor deposition (hereinafter, referred to as MOCVD) or molecular beam epitaxy (hereinafter, referred to as MBE) each having high controllability for the film thickness are employed. FIG. 2(a) shows a cross-section of the wafer after the growth.

The surface of the p type first upper cladding layer 4a is covered with the $SiO_2$ film 16, having a stripe shaped opening 16a extending in the laser resonator length direction and having a length not reaching a position of what becomes the laser resonator facet on what becomes an active region, as shown in FIG. 2(b). The $SiO_2$ film 16 is formed by plasma CVD (chemical vapor deposition) or sputtering. The thickness of the $SiO_2$ film 16 is preferably 1000 Å and the stripe width of the opening 16a is preferably 1~5 µm. The interval between the opening and the position of what becomes the laser resonator facet is preferably about 20 µm. Next, the wafer is annealed at a temperature above 800° C. The annealing is performed in an ambient with As pressure applied in order to prevent escape of As from the opening 16a.

As described in Applied Physics Letters, vol. 52, 1988, pp 1511–1531, the $SiO_2$ film can absorb Ga atoms from the GaAs or AlGaAs crystal during annealing, so that Ga atoms escape out from the surface of the p type first upper cladding layer 4a adjacent a region other than the opening 16a of the $SiO_2$ film 16, thereby generating vacancies where Ga atoms are missing from lattice positions of the p type first upper cladding layer 4a where Ga atoms are originally present. When the vacancies are further diffused into the semiconductor crystal by annealing to reach the quantum-well structure active layer 3, disordering of the quantum-well structure occurs. Therefore, in the active layer 3 directly below the $SiO_2$ film 16, Ga atoms escape to form vacancies and disordering of the quantum-well structure occurs and the vacancies are diffused, thereby increasing effective band gap energy in this region. As a result, the regions in the vicinity of the laser resonator facets of the disordered regions serve as window structure parts 3b functioning as "window" for the laser beam that is emitted from the active region 3a of the active layer 3 that is positioned under the $SiO_2$ film opening 16a and is not disordered. In addition, the thickness of the p type first upper cladding layer 4a is preferably less than 0.5 µm because the distance along which the Ga vacancies efficiently diffuse is less than 0.5 µm.

After the annealing, the $SiO_2$ film 16 is removed by wet etching, and the p type second upper cladding layer 4b and the p type contact layer 5 are epitaxially grown on the p type first upper cladding layer 4a. Thereafter, the surface of the contact layer 5 is covered with the resist film and it is patterned by photolithography, and then in the step of FIG. 2(e), a stripe shaped resist 17 extending in the laser resonator length direction and having approximately the same size as the opening 16a is formed on a region where the opening 16a of the $SiO_2$ film 16 was formed, and proton implantation 23 is carried out from above the contact layer 5, employing the resist 17 as a mask, so that the implantation peak is positioned in the p type second upper cladding layer 4b and the concentration of the protons is $4\times10^{19}$ cm$^{-3}$. As a result, regions 8 where implantation of protons is carried out are formed on the contact layer 5 and the second upper cladding layer 4b except below the resist 17. These proton implantation regions 8 are high resistance regions and function as current blocking layers.

At last, a p side electrode 10 is formed on the contact layer 5 and an n side electrode 9 is formed on the rear surface of the GaAs substrate 1, and a pair of laser resonator facets 20 are formed by cleaving the wafer, resulting in a semiconductor laser device.

A description is given of the operation. When a voltage is applied with the p side electrode 10 a plus voltage and the n side electrode 9 a minus voltage, holes are injected, passing through the p type contact layer 5, the p type second upper cladding layer 4b, and the p type first upper cladding layer 4a into the quantum-well structure active layer 3, and electrons are injected, passing through the n type semiconductor substrate 1 and the n type AlGaAs cladding layer 2 into the quantum-well structure active layer 3. Then, radiative recombination of electrons and holes occurs in the active region of the active layer 3, thereby generating induced emission of light in the active region 3a comprising the quantum-well structure active layer 3. When light having a gain higher than the loss of the waveguide is generated by increasing sufficiently the injected quantity of carriers, the laser oscillation occurs. Here, since the regions 8 where protons are implanted have a high resistance, no current flows through the p type contact layer 5 and the p type second upper cladding layer 4b in these regions 8. In other words, a current flows only through the region where no protons are implanted.

Since in the semiconductor laser device of this first embodiment the active layer 3 in the vacancy diffusion region 6 is disordered by the diffusion of vacancies, the band gap energy thereof is larger than that in the region which is not disordered, of the active region 3a, whereby the region in the vicinity of the laser resonator facet 20 of the disordered region functions as a window structure region 3b which does not absorb the laser light. Further, since the region adjacent the active region 3a, perpendicular to the laser resonator length direction, of the active layer 3 is also disordered, a refractive index distribution is produced in the direction perpendicular to the laser resonator length direction in the active layer 3, whereby the laser beam is confined in the active region 3a and is guided in the laser resonator length direction.

In the first embodiment, annealing is carried out with the SiO$_2$ film 16 disposed on the surface of the p type Al$_r$Ga$_{1-r}$As (r=0.5) first upper cladding layer 4a, whereby vacancies are formed in the p type first upper cladding layer 4a and the quantum-well structure active layer 3 is disordered with the diffused vacancies. Therefore, implantation of Si ions is not required for the disordering as in the prior art, and a lot of crystal defects which would be otherwise generated due to Si ions having high energy colliding with the crystals at the ion implantation can be avoided. Thereby, generation of crystal transitions can be suppressed and the disordered region can be prevented from failing to function as a window structure due to the laser beam being absorbed by the crystal transitions as has been a problem in the prior art. Therefore, it is possible to obtain a high light output operation from a semiconductor laser device with a window structure, that exhibits superior device characteristics with a high facet destruction level and high reliability.

Since there is no implanting process of Si ions with high energy as in the prior art, the amount of the crystal defects generated can be significantly decreased, and there arises no unlikelihood of disordering due to Si ions being trapped by a lot of crystal defects by diffusing the vacancies instead of Si for disordering the active layer 3, a semiconductor laser device with a desired window structure can be obtained with high reproducibility.

According to the first embodiment, annealing is carried out with the SiO$_2$ film 16 disposed on the surface of the p type Al$_r$Ga$_{1-r}$As (r=0.5) first upper cladding layer 4a, whereby vacancies are formed in the p type first upper cladding layer 4a and the quantum-well structure active layer 3 is disordered by the diffused vacancies. Therefore, a window structure with small number of crystal transitions can be formed by disordering the active layer 3 without implanting Si ions and a semiconductor laser device provided with such a desired window structure can be obtained with high reproducibility.

Embodiment 2

Figure 3:
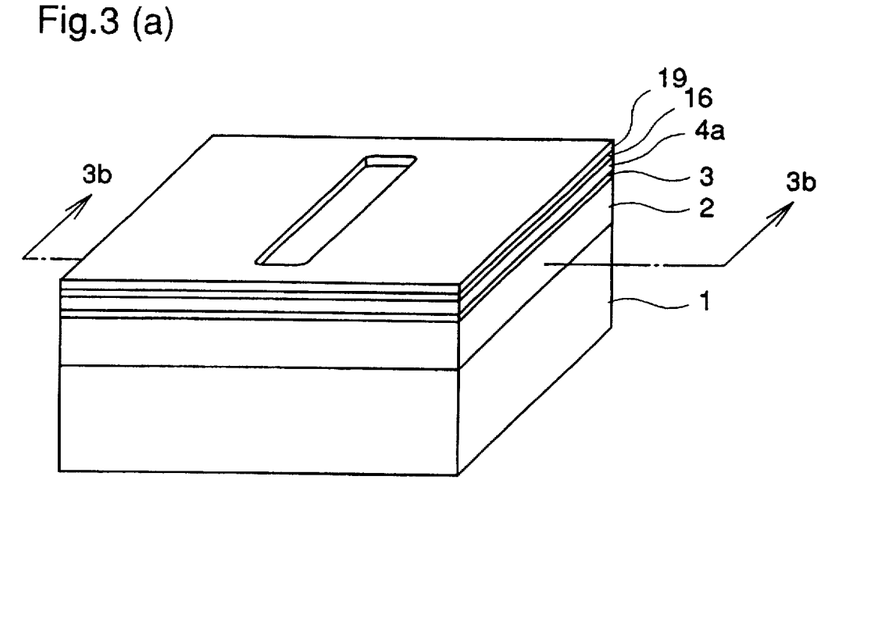
FIGS. 3(a)-3(b) are diagrams illustrating main process steps in a method of fabricating a semiconductor laser device according to a second embodiment of the present invention.

FIG. 3(a) is a perspective view illustrating a main process step in a method of fabricating a semiconductor laser device according to a second embodiment of the present invention and FIG. 3(b) is a sectional view taken along a line 3b—3b of FIG. 3(a). In FIGS. 3(a)–3(b), the same reference numerals as in FIGS. 2(a)–2(e) designate the same or corresponding parts. Reference numeral 19 designates an Si$_3$N$_4$ film. In the process of diffusing the vacancies in accordance with the first embodiment, after an SiO$_2$ film 16 having an opening 16a is formed, a region including the opening 16a is covered with the Si$_3$N$_4$ film 19 to perform the annealing as shown in FIG. 3(a). Other process steps are the same as in the first embodiment.

In the first embodiment, the p type Al$_r$Ga$_{1-r}$As (r=0.5) first upper cladding layer 4a is exposed at the stripe shaped opening 16a formed in the SiO$_2$ film 16. Even though the annealing is performed under environment where the As pressure is applied, if the crystal surface is exposed during the annealing when the vacancies are diffused, escape of As atoms from the surface is not perfectly suppressed and there is generated surface roughness at the p type first upper cladding layer 4a in the opening 16a. In addition, there is a tendency that this surface roughness becomes worse as the Al composition ratio is higher. When surface roughness is generated, crystal transitions arise during crystal regrowth on the p type first upper cladding layer 4a having a rough surface, and the crystal transitions enter into the active layer 3, thereby deteriorating the operating characteristics and reliability, resulting in difficulty in producing a high quality semiconductor laser device. In this second embodiment, the p type Al$_r$Ga$_{1-r}$As (r=0.5) first upper cladding layer 4a in the opening 16a is not exposed by covering the region including the opening 16a with the Si$_3$N$_4$ film 19 as shown in FIGS. 3(a)–3(b), whereby surface roughening of the p type Al$_r$Ga$_{1-r}$As (r=0.5) first upper cladding layer 4a during annealing can be prevented. In addition, after the annealing, the Si$_3$N$_4$ film 19 is removed together with the SiO$_2$ film 16 by dry etching employing CF$_4$ and wet etching comprising hydrofluoric acid.

According to the second embodiment, since the annealing is performed after the region including the opening 16a of the SiO$_2$ film 16 disposed on the p type Al$_r$Ga$_{1-r}$As (r=0.5) first upper cladding layer 4a is covered with the Si$_3$N$_4$ film 19, the surface roughening of the p type Al$_r$Ga$_{1-r}$As (r=0.5) first upper cladding layer 4a exposed on the opening 16a of the SiO$_2$ film 16 due to escape of As atoms is suppressed, thereby producing a semiconductor laser device with high operating characteristic and high reliability.

Embodiment 3

Figure 4:
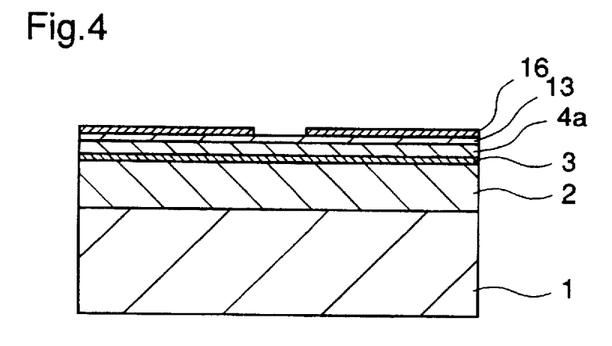
FIG. 4 is a sectional view illustrating a main process step in a method of fabricating a semiconductor laser device according to a third embodiment of the present invention.

FIG. 4 is a sectional view perpendicular to the laser resonator length direction, illustrating a main process step in a method of fabricating a semiconductor laser device according to a third embodiment of the present invention. In FIG. 4, the same reference numerals as in FIGS. 2(a)-2(e) designate the same or corresponding parts. Reference numeral 13 designates a GaAs surface protecting layer. In the third embodiment, after the p type $Al_rGa_{1-r}As$ (r=0.5) first upper cladding layer 4a is formed as shown in FIG. 2(a), the p type GaAs protecting layer 13 is further subsequently epitaxially grown, the $SiO_2$ film 16 including the opening 16a at the surface of the p type GaAs protecting layer 13 is formed, and the annealing is performed to make Ga escape to form vacancies as well as to diffuse those vacancies. Other process steps are the same as in the first embodiment.

In the first embodiment, the $SiO_2$ film 16 is epitaxially grown on the p type $Al_rGa_{1-r}As$ (r=0.5) first upper cladding layer 4a and the active layer 3 is disordered by the annealing to form vacancies as well as to diffuse the vacancies and, thereafter, the $SiO_2$ film 16 is removed and the second upper cladding layer 4b and the contact layer 5 are epitaxially grown. However, the first upper cladding layer 4a having the crystal regrowth surface includes a large quantity of Al atoms, and this layer is easily oxidized. Accordingly, when the first upper cladding layer 4a is exposed to the air in the step of forming the $SiO_2$ film 16, surface roughness is generated by oxidation, and there occur crystal transitions at the regrowth interface. In addition, the crystal transitions are broadened at the active layer 3 and the performance of the semiconductor laser device is deteriorated because the laser beam is absorbed by the crystal transitions.

In the third embodiment, the GaAs surface protecting layer 13 is further successively formed on the first upper cladding layer 4a which is epitaxially grown, the $SiO_2$ film 16 is formed on the GaAs surface protecting layer 13, and the annealing is performed to form vacancies as well as to diffuse those vacancies, thereby disordering the active layer 3. Thereafter, when the $SiO_2$ film 16 is removed and the second upper cladding layer 4 and the contact layer 5 are again epitaxially grown on the GaAs surface protecting layer 13, the GaAs surface protecting layer 13 having a regrowth interface does not include Al atoms and this layer is hard to oxidized, whereby surface roughness due to oxidation is suppressed and the crystal transitions at the regrowth interface are reduced. In addition, since the GaAs surface protecting layer 13 may absorb the laser light dependent on the composition and the structure of the active layer 3, the thickness of the GaAs surface protecting layer 13 is preferred to be a thickness that has no effects on the laser characteristic, i.e., a thickness less than 100 Å.

According to the third embodiment, after the GaAs surface protecting layer 13 is formed on the p type $Al_rGa_{1-r}As$ (r=0.5) first upper cladding layer 4a following the epitaxial growth of the first upper cladding layer 4a, an $SiO_2$ film 16 is formed and annealing is performed to form vacancies and to diffuse the vacancies. Therefore, generation of surface roughness of the regrown interface due to oxidation can be suppressed, and the crystal transitions at the regrown interface can be reduced, whereby a semiconductor laser device with high quality operating characteristics and high reliability is obtained.

In the above-described embodiments, the semiconductor laser device having a structure in which the contact layer 5 and the upper parts of the first upper cladding layer 4a and the second upper cladding layer 4b on the region except the active region 3a of the active layer 3 are made of high resistivity by proton implantation is described. In the present invention, a semiconductor laser device having another structure such as a ridge structure may be used. Even in this case, the vacancies are diffused in the vicinity of the laser resonator facet, whereby the quantum-well structure active layer 3 is disordered, with the same effects as in the above-described embodiments.

While in the above-described embodiments the n type GaAs substrate is employed as the semiconductor substrate 1, a p type GaAs substrate may be employed in the present invention, with the same effects as in the above-described embodiments.

While in the above-described embodiments the active layer 3 has a multi-quantum-well structure (MQW), another quantum-well structure such as a single-quantum-well structure (SQW) may be used as the active layer 3 in the present invention, with the same effects as in the above-described embodiments.

What is claimed is:

1. A semiconductor laser device comprising:

a first conductivity type GaAs substrate;

a first conductivity type $Al_xGa_{1-x}As$ (0<x<1) lower cladding layer disposed on the substrate;

a quantum-well structure active layer comprising first conductivity type $Al_zGa_{1-z}As$ (0<z<x) barrier layers and $Al_yGa_{1-y}As$ (0<y<z) well layers, and having a disordered window region including Ga vacancies disordering the window region, the disordered window region being located proximate a laser facet, the quantum-well structure active layer being disposed on the lower cladding layer and including a striped-shaped region extending in a laser resonator direction, the quantum-well structure active layer having disordered regions including Ga vacancies on opposite sides of the stripe-shaped active region;

a second conductivity type $Al_rGa_{1-r}As$ (z<r<1) first upper cladding layer disposed on the quantum-well structure active layer;

a GaAs surface-protecting layer disposed on the second conductivity type first upper cladding layer;

a second conductivity type $Al_rGa_{1-r}As$ (z<r<1) second upper cladding layer disposed on the surface-protecting layer;

a second conductivity type GaAs contact layer disposed on the second upper cladding layer regions of the second upper cladding layer and the contact layer not opposite the stripe-shaped active region being implanted with protons and having a high resistance; and electrodes disposed on the GaAs substrate and on the contact layer, respectively.

* * * * *